(12) United States Patent
Li et al.

(10) Patent No.: US 8,811,091 B2
(45) Date of Patent: Aug. 19, 2014

(54) NON-VOLATILE MEMORY AND METHOD WITH IMPROVED FIRST PASS PROGRAMMING

(75) Inventors: Yan Li, Milpitas, CA (US); Cynthia Hsu, Fremont, CA (US); Ken Oowada, Fujisawa (JP)

(73) Assignee: Sandisk Technologies, Inc., Plano, TX (US)

( * ) Notice: Subject to any disclaimer, the term of this patent is extended or adjusted under 35 U.S.C. 154(b) by 333 days.

(21) Appl. No.: 13/329,103

(22) Filed: Dec. 16, 2011

(65) Prior Publication Data
US 2013/0155769 A1    Jun. 20, 2013

(51) Int. Cl.
G11C 11/34    (2006.01)
G11C 16/04    (2006.01)

(52) U.S. Cl.
USPC ............ 365/185.24; 365/185.19; 365/185.22; 365/185.03

(58) Field of Classification Search
USPC ............. 365/185.19, 185.22, 185.03, 185.18, 365/185.24
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,661,053 A | 8/1997 | Yuan |
| 5,768,192 A | 6/1998 | Eitan |
| 5,903,495 A | 5/1999 | Takeuchi et al. |
| 6,011,725 A | 1/2000 | Eitan |
| 6,046,935 A | 4/2000 | Takeuchi et al. |
| 6,222,762 B1 | 4/2001 | Guterman et al. |
| 7,224,614 B1 | 5/2007 | Chan |
| 2005/0190603 A1 | 9/2005 | Lee |
| 2008/0219057 A1* | 9/2008 | Li .............................. 365/185.22 |
| 2008/0304316 A1* | 12/2008 | Mokhlesi .................... 365/185.2 |
| 2009/0168540 A1* | 7/2009 | Nguyen et al. ............ 365/185.21 |
| 2010/0074011 A1 | 3/2010 | Kang |
| 2010/0172180 A1 | 7/2010 | Paley et al. |
| 2011/0157997 A1 | 6/2011 | Kamigaichi |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
Notification of Transmittal of International Search Report and The Written Opinion of The International Searching Authority, Or the Declaration, mailed on May 9, 2013, 14 pages.

* cited by examiner

*Primary Examiner* — Son Dinh
*Assistant Examiner* — Uyen B Tran
(74) *Attorney, Agent, or Firm* — Davis Wright Tremaine LLP

(57) ABSTRACT

A nonvolatile memory with a multi-pass programming scheme enables a page of multi-level memory cells to be programmed with reduced floating-gate to floating-gate perturbations (Yuping effect). The memory cells operate within a common threshold voltage range or window, which is partitioned into multiple bands to denote a series of increasingly programmed states. The series is divided into two halves, a lower set and a higher set. The memory cells are programmed in a first, coarse programming pass such that the memory cells of the page with target states from the higher set are programmed to a staging area near midway in the threshold window. In particular, they are programmed closer to their targeted destinations than previous schemes, without incurring much performance penalty. Subsequent passes will then complete the programming more quickly. Yuping effect is reduced since the threshold voltage change in subsequent passes are reduced.

16 Claims, 11 Drawing Sheets

Tyical Progam/Verify voltages on a Word Line during normal use of the memory

**Logical-Page-by-Logical-Page Programming
(2-bit LM Gray Code)**

FIG. 7    LM-Foggy-Fine Programming (3-bit LM Gray Code)

FIG. 8   Improved LM-Foggy-Fine Programming (First Embodiment)

FIG. 9   Improved LM-Foggy-Fine Programming (Second Embodiment)

Multi-pass Programming – First Embodiment

Multi-pass Programming – Second Embodiment

NON-VOLATILE MEMORY AND METHOD WITH IMPROVED FIRST PASS PROGRAMMING

FIELD OF THE INVENTION

This application relates to the operation of re-programmable non-volatile memory systems such as semiconductor flash memory, and, more specifically, to flash memory having accurate and efficient programming schemes.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card are ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

It is common in current commercial products for each storage element of a flash EEPROM array to store a single bit of data by operating in a binary mode, where two ranges of threshold levels of the storage element transistors are defined as storage levels. The threshold levels of transistors correspond to ranges of charge levels stored on their storage elements. In addition to shrinking the size of the memory arrays, the trend is to further increase the density of data storage of such memory arrays by storing more than one bit of data in each storage element transistor. This is accomplished by defining more than two threshold levels as storage states for each storage element transistor, four such states (2 bits of data per storage element) now being included in commercial products. More storage states, such as 16 states per storage element, are also being implemented. Each storage element memory transistor has a certain total range (window) of threshold voltages in which it may practically be operated, and that range is divided into the number of states defined for it plus margins between the states to allow for them to be clearly differentiated from one another. Obviously, the more bits a memory cell is configured to store, the smaller is the margin of error it has to operate in.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also non-volatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Cell's Floating-Gate to Floating-Gate Program Disturb (the "Yupin Effect")

The charge programmed into the charge storage element of one memory cell produces an electric field that perturbs the electric field of a neighboring memory cell. Generally, an erased cell has no charge in its floating gate and has the lowest threshold voltage. As the memory cell is increasingly programmed with more charges into the floating gate, its threshold voltage increases. The memory cell generally operates within a range of threshold voltages (threshold window). The threshold window is partitioned into a plurality of subranges or bands of threshold voltages, each representing a memory state. As a field-effect transistor with a floating gate, the charges programmed into the floating gate of a memory cell determines its threshold voltage and which in turn determines what memory state it is in. However, as the intercellular distance is shrunk, the memory cell may begin to "see" the charges programmed into the floating gates of its neighbors. Thus, it sees more charge than it really has and has the virtual effect of increasing its threshold voltage.

If a memory cell is program-verified under a first field environment and later is read again under a different field environment due to neighboring cells subsequently being programmed with different charges, the read accuracy may be affected by what is referred to as the "Yupin Effect" which is a disturb due to coupling between neighboring floating gates. With ever higher integration in semiconductor memories, the perturbation of the electric field due to the stored charges between memory cells (Yupin effect) becomes increasing appreciable as the inter-cellular spacing shrinks.

The Yupin effect can be mitigated by minimizing the asymmetry in field environment for a cell due to its neighbors, between the time the cell has finished program-verify (i.e. programmed to its target state) to the time when its neighbors has finished programming. In this way, when the cell is being program-verified at its target state, it sees a first field environment due to its neighbors, and subsequently with the completion of programming of its neighbors, it see a second field environment, and the difference between these two field environment are minimized. The Yupin effect is a program disturb that affects adjacent cells along a row and across bit lines (BL-BL Yupin effect) and along a column across word lines (WL-WL Yupin effect) of a memory array.

One way to reduce BL-BL Yupin effect is to adopt a multi-pass programming scheme for programming a page of memory cells on a word line in parallel. In a first programming pass, the memory cells targeted to the more programmed states (ones that will have their threshold voltages moved from an erased state at a lower end of the threshold window to a higher end) are initially programmed to a staging area near halfway of the threshold window. In subsequent programming passes, they are programmed from the staging area to their final target destinations. In this way, the difference between the first and second field environment seen by a memory cell is due to the threshold voltages of its neighbors not moving across the full extent but at most across half of the threshold window.

A conventional method of implementing the above-mentioned multi-pass programming is performed a series of binary programming, in which at each programming pass the threshold window is binary divided and memory cells with target states belonging to the upper half of the binary divisions is programmed to the lower middle portion of the binary divisions. Each further programming pass iterates the binary division programming until in a final programming pass all memory cells of the page are programmed to their final destinations. A preferred coding that goes along with such programming scheme is given by the "LM" coding.

However, the LM coding and programming method is not the most efficient.

There is still a general need for more efficient schemes for programming a nonvolatile memory to help minimize program disturb due to Yupin effect.

SUMMARY AND OBJECTS OF THE INVENTION

According to one embodiment of the invention, a page of memory cells operating within a common threshold voltage window is programmed by an improved multi-pass programming operation. The multi-pass programming includes a first "Improved LM" programming pass which comprises selecting a first set of memory cells of the page with target states in an upper half of the threshold window for programming, programming and verifying each memory cell of the first set with programming voltage pulse by pulse until said each memory cell has been verified to have passed a predetermined verify point near a middle portion of the threshold window, and after all memory cells of the first set have been program-verified, further enabling the program-verified memory cells to a number of additional programming pulses without intervening verify, the number being dependent on the target state. The Improved LM pass is followed by one or more programming passes in which all memory cells of the page are more finely programmed to their final destinations.

In particular, when the memory has a target state of a more programmed state or higher up the threshold window relative to the staging area, the larger is the number of additional programming pulses it will receive.

In this way, the improved LM pass programs each memory cell closer to its final destination compared to conventional LM programming pass implementations. This will reduce the programming needed in subsequent passes, thereby improving performance. Overall time is saved as it is faster to move the memory cell in the threshold window during the improved LM pass than in subsequent passes because of the more efficient, coarser programming pulses and the absence of intervening verify operations.

According to a second embodiment of the invention, a page of memory cells operating within a common threshold voltage window is programmed by an improved multi-pass programming operation. The multi-pass programming includes a first "Improved LM" programming pass which comprises selecting a first set of memory cells of the page with target states in an upper half of the threshold window for programming, programming and verifying each memory cell of the first set with programming voltage pulse by pulse until said each memory cell has been verified to have passed a predetermined verify point near a middle portion of the threshold window, and while the programming and verifying is ongoing for remaining memory cells of the first set that have yet to be program-verified at the predetermined verify point, the program-verified memory cells are further program-enabled to a number of on-going programming pulses without intervening verify on the program-verified memory cells, the number being dependent on the target state. The Improved LM pass is followed by one or more programming passes in which all memory cells of the page are more finely programmed to their final destinations.

In particular, when the memory has a target state of a more programmed state or higher up the threshold window relative to the staging area, the larger is the number of additional programming pulses it will receive, but limited by the availability of the ongoing programming pulse.

The second embodiment, similar to the first embodiment of the improved LM pass, programs each memory cells closer to its final destination compared to previous LM programming pass implementations. This will reduce the programming needed in subsequent passes, thereby improving performance. Overall time is saved because, it is faster to move the memory cell in the threshold window during the improved LM pass than in subsequent passes because the additional programming pulses incurred in the improved LM pass is more efficient due to coarser programming pulses and the absence of intervening verify operations. In particular, the second embodiment operates only within the ongoing number of programming pulses needed to program-verify all memory cells of the first set, and not additional ones.

Additional objects, features and advantages of the present invention will be understood from the following description of its preferred embodiments, which description should be taken in conjunction with the accompanying drawings.

DESCRIPTION OF THE PREFERRED EMBODIMENTS

Memory System

Figure 1:
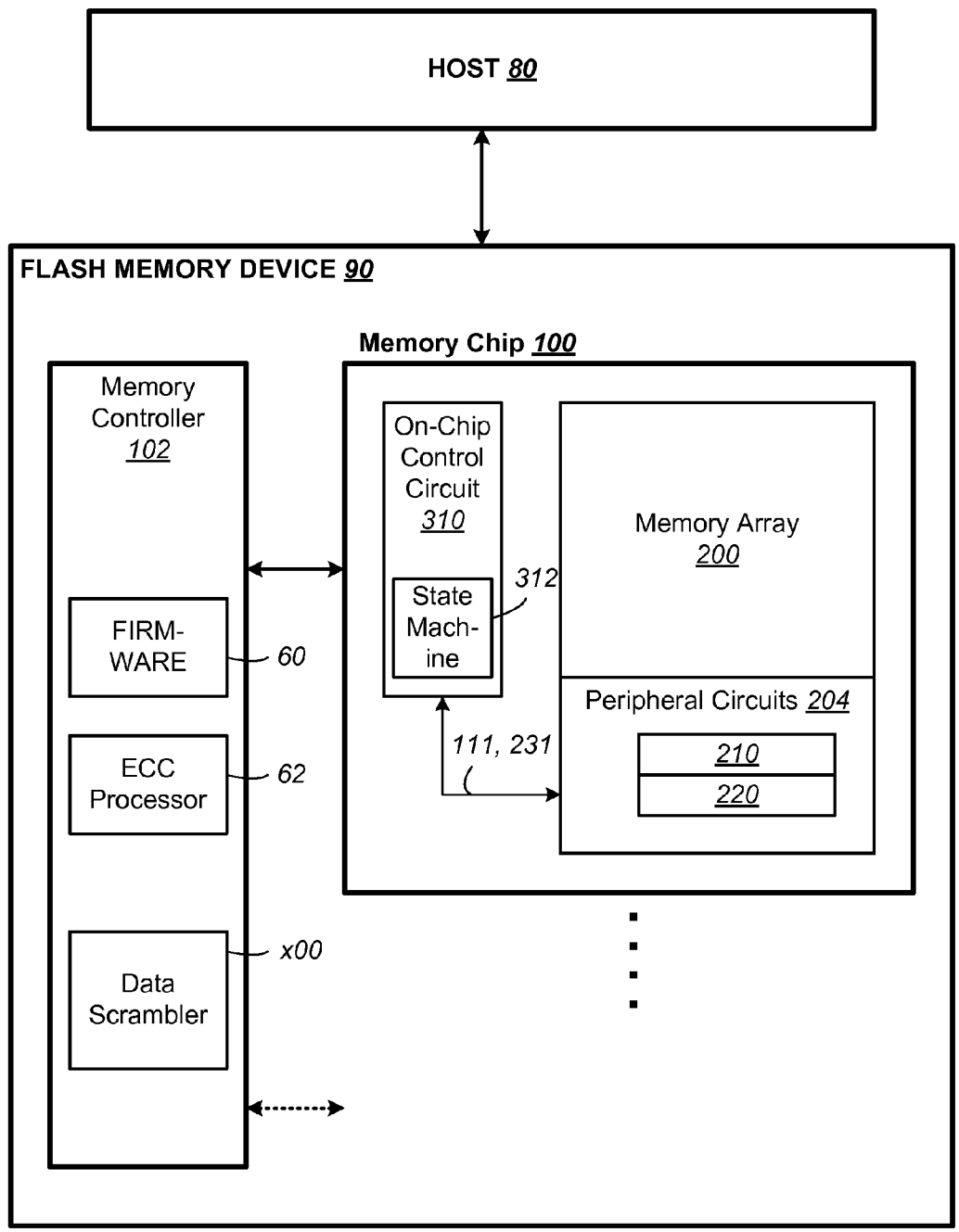
FIG. 1 illustrates a host in communication with a memory device in which the features of the present invention are embodied.

FIG. 1 illustrates a host in communication with a memory device in which the features of the present invention are embodied. The host 80 typically sends data to be stored at the memory device 90 or retrieves data by reading the memory device 90. The memory device 90 includes one or more memory chip 100 managed by a memory controller 102. The memory chip 100 includes a memory array 200 of memory cells with each cell capable of being configured as a multi-level cell ("MLC") for storing multiple bits of data, as well as capable of being configured as a single-level cell ("SLC") for storing 1 bit of data.

The memory chip also includes peripheral circuits 204 such as row and column decoders, sense modules 210, data latches 220 and I/O circuits. An on-chip control circuitry 310 controls low-level memory operations of each chip. The control circuitry 310 is an on-chip controller that cooperates with the peripheral circuits to perform memory operations on the memory array 200. The control circuitry 310 typically includes a state machine 312 to provide chip level control of memory operations via a data bus 231 and control and address bus 111.

In many implementations, the host 80 communicates and interacts with the memory chip 100 via the memory controller 102. The controller 102 co-operates with the memory chip and controls and manages higher level memory operations. A firmware 60 provides codes to implement the functions of the controller 102. An error correction code ("ECC") processor 62 processes ECC during operations of the memory device.

For example, in a host write, the host 10 sends data to be written to the memory array 100 in logical sectors allocated from a file system of the host's operating system. A memory block management system implemented in the controller stages the sectors and maps and stores them to the physical structure of the memory array. A preferred block management system is disclosed in United States Patent Application Publication Number: US-2010-0172180-A1, the entire disclosure of which is incorporated herein by reference.

Physical Memory Architecture

In order to improve read and program performance, multiple charge storage elements or memory transistors in an array are read or programmed in parallel. Thus, a "page" of memory elements (physical page) are read or programmed together. In existing memory architectures, a row typically contains one or more physical page. All memory elements of a page will be read or programmed together.

Figure 2:
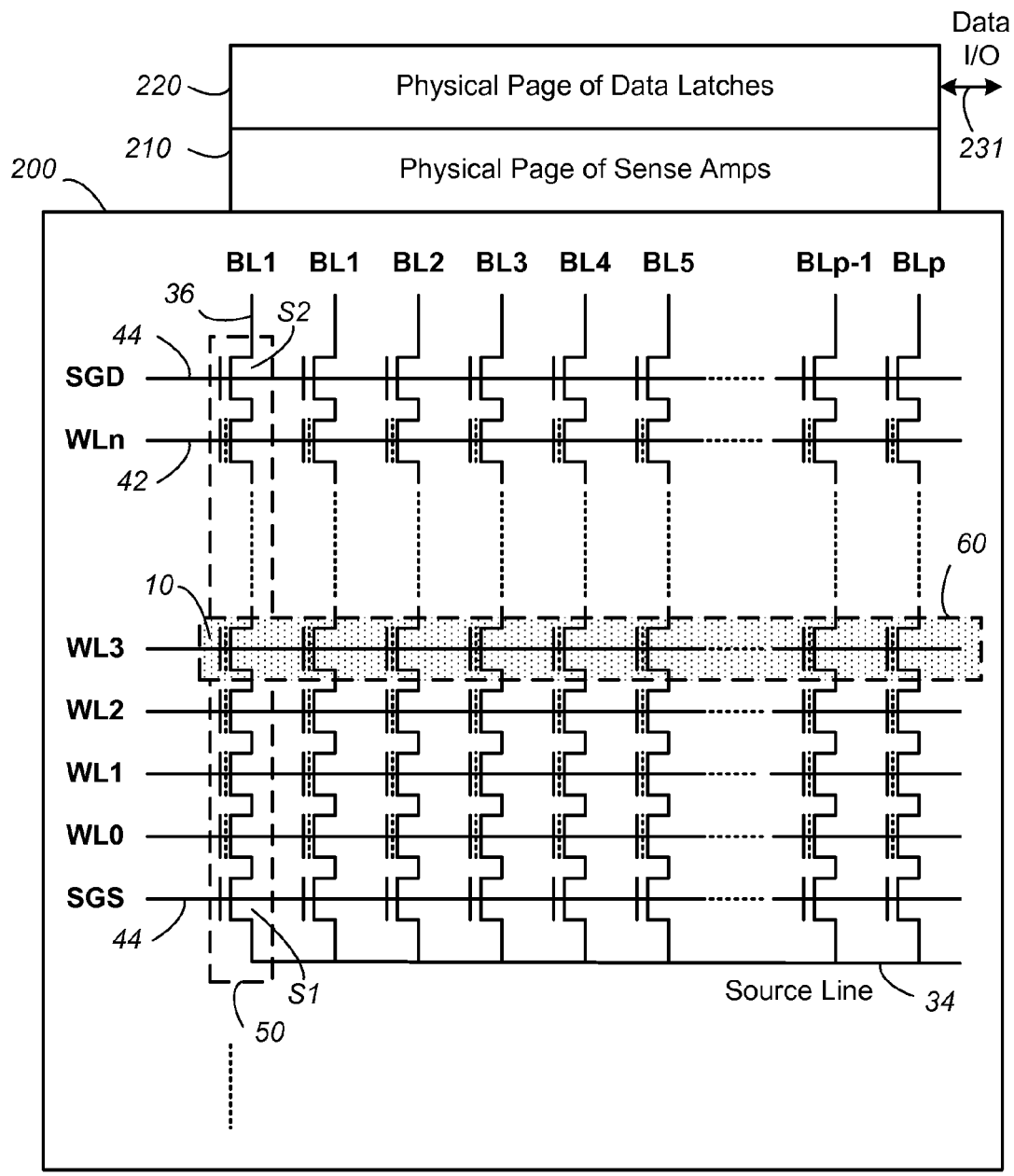
FIG. 2 illustrates a page of memory cells, organized for example in the NAND configuration, being sensed or programmed in parallel.

FIG. 2 illustrates a page of memory cells, organized for example in the NAND configuration, being sensed or programmed in parallel. FIG. 2 essentially shows a bank of NAND strings 50 in the memory array 200 of FIG. 1. A "page" such as the page 60, is a group of memory cells enabled to be sensed or programmed in parallel. This is accomplished in the peripheral circuits by a corresponding page of sense amplifiers 210. The sensed results are latches in a corresponding set of data latches 220. Each sense amplifier can be coupled to a NAND string, such as NAND string 50 via a bit line 36. For example, the page 60 is along a row and is sensed by a sensing voltage applied to the control gates of the cells of the page connected in common to the word line WL3. Along each column, each cell such as cell 10 is accessible by a sense amplifier via a bit line 36. Data in the data latches 220 are toggled in from or out to the memory controller 102 via a data I/O bus 231.

The NAND string 50 is a series of memory transistors 10 daisy-chained by their sources and drains to form a source terminal and a drain terminal respective at its two ends. A pair of select transistors S1, S2 controls the memory transistors chain's connection to the external via the NAND string's source terminal and drain terminal respectively. In a memory array, when the source select transistor S1 is turned on, the source terminal is coupled to a source line 34. Similarly, when the drain select transistor S2 is turned on, the drain terminal of the NAND string is coupled to a bit line 36 of the memory array. Each memory transistor 10 in the chain acts as a memory cell. It has a charge storage element 20 to store a given amount of charge so as to represent an intended memory state. A control gate of each memory transistor allows control over read and write operations. The control gates of corresponding memory transistors of a row of NAND string are all connected to the same word line (such as WL0, WL1, . . . ) Similarly, a control gate of each of the select transistors S1, S2 (accessed via select lines SGS and SGD respectively) provides control access to the NAND string via its source terminal and drain terminal respectively.

The page referred to above is a physical page memory cells or sense amplifiers. Depending on context, in the case where each cell is storing multi-bit data, each physical page has multiple data pages.

Also the physical page may store one or more logical sectors of data. Typically, the host 80 (see FIG. 1) operating with a disk operating system manages the storage of a file by organizing the content of the file in units of logical sectors, which is typically in one or more units of 512 bytes.

In the examples to be given later, a physical page may have 16 kB of memory cells being sensed in parallel by corresponding 16 kB of sense amplifiers via 16 kB of bit lines. An example logical sector assigned by the host has a size of 2 kB of data. Thus, a physical page can store 8 sectors if the cells are each configured to store 1 bit of data (SLC). For MLC such as each cell storing 2 bits of data, each physical page can store 16 logical sectors, etc.

Erase Blocks

One important difference between flash memory and other type of memory is that a cell must be programmed from the erased state. That is the floating gate must first be emptied of charge. Programming then adds a desired amount of charge back to the floating gate. It does not support removing a portion of the charge from the floating to go from a more programmed state to a lesser one. This means that update data cannot overwrite existing one and must be written to a previous unwritten location.

Furthermore erasing is to empty all the charges from the floating gate and generally takes appreciably time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together.

Figure 3:
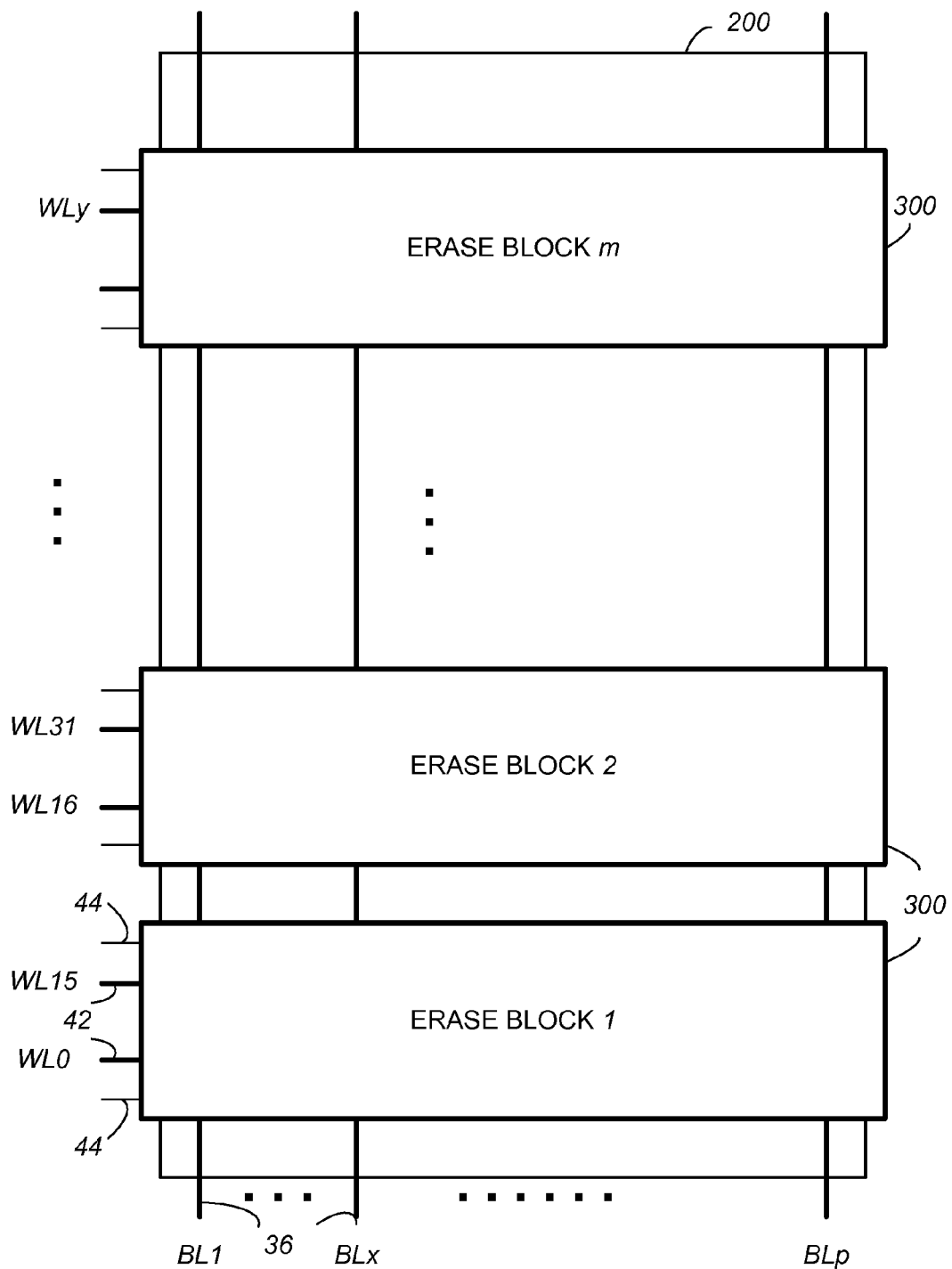
FIG. 3 illustrates schematically an example of a memory array organized in erasable blocks.

FIG. 3 illustrates schematically an example of a memory array organized in erasable blocks. Programming of charge storage memory devices can only result in adding more charge to its charge storage elements. Therefore, prior to a program operation, existing charge in charge storage element of a memory cell must be removed (or erased). A non-volatile memory such as EEPROM is referred to as a "Flash" EEPROM when an entire array of cells 200, or significant groups of cells of the array, is electrically erased together (i.e., in a flash). Once erased, the group of cells can then be reprogrammed. The group of cells erasable together may consist of one or more addressable erase unit 300. The erase unit or block 300 typically stores one or more pages of data, the page being a minimum unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

In the example shown in FIG. 3, individual memory cells in the memory array 200 are accessible by word lines 42 such as WL0-WLy and bit lines 36 such as BL0-BLx. The memory is organized into erase blocks, such as erase blocks 0, 1, . . . m. If the NAND string 50 (see FIG. 2) contains 16 memory cells, then the first bank of NAND strings in the array will be accessible by select lines 44 and word lines 42 such as WL0 to WL15. The erase block 0 is organized to have all the memory cells of the first bank of NAND strings erased together. In memory architecture, more than one bank of NAND strings may be erased together.

Figure 4:
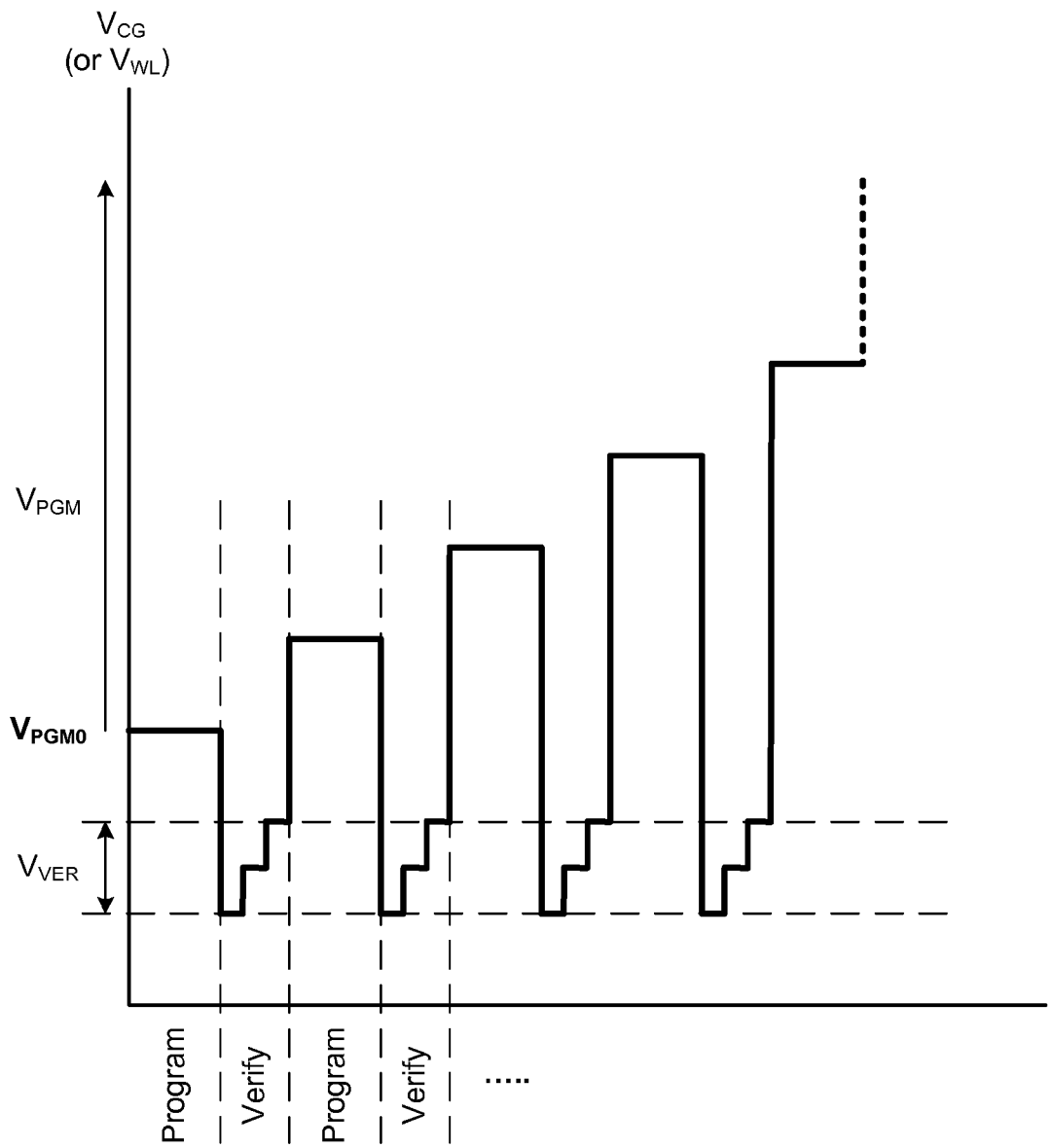
FIG. 4 illustrates a series of programming voltage pulses in the form of a staircase waveform being applied to a selected word line.

FIG. 4 illustrates a series of programming voltage pulses in the form of a staircase waveform being applied to a selected word line. When a cell is programmed to a given state, it is subject to successive programming voltage pulses, each time attempting to add incremental charges to the floating gate. In between programming pulses, the cell is read back or verified to determine its source-drain current relative to a breakpoint level. Programming stops for a cell when it has been verified to reach the desired state. The programming pulse train used may have increasing period or amplitude in order to counteract the accumulating electrons programmed into the charge storage unit of the memory cell. A pulse that moves more charge into a memory cell than another is said to be coarser or that another programs with a finer granularity. Programming circuits generally apply a series of programming pulses to a selected word line. In this way, a page of memory cells whose control gates are connected to the word line can be programmed together. Whenever a memory cell of the page has been programmed to its target state, it is program-inhibited while the other cells continue to be subject to programming until all cells of the page have been program-verified.

Cell's Floating-Gate to Floating-Gate Program Disturb (the "Yupin Effect")

The charge programmed into the charge storage element of one memory cell produces an electric field that perturbs the electric field of a neighboring memory cell. Generally, an erased cell has no charge in its floating gate and has the lowest threshold voltage. As the memory cell is increasingly programmed with more charges into the floating gate, its threshold voltage increases. The memory cell generally operates within a range of threshold voltages (threshold window). The threshold window is partitioned into a plurality of subranges or bands of threshold voltages, each representing a memory state. As a field-effect transistor with a floating gate, the charges programmed into the floating gate of a memory cell determines its threshold voltage and which in turn determines what memory state it is in. However, as the intercellular distance is shrunk, the memory cell may begin to "see" the charges programmed into the floating gates of its neighbors. Thus, it sees more charge than it really has and has the virtual effect of increasing its threshold voltage.

If a memory cell is program-verified under a first field environment and later is read again under a different field environment due to neighboring cells subsequently being programmed with different charges, the read accuracy may be affected by what is referred to as the "Yupin Effect" which is a disturb due to coupling between neighboring floating gates. With ever higher integration in semiconductor memories, the perturbation of the electric field due to the stored charges between memory cells (Yupin effect) becomes increasing appreciable as the inter-cellular spacing shrinks.

The Yupin effect can be mitigated by minimizing the asymmetry in field environment for a cell due to its neighbors, between the time the cell has finished program-verify (i.e. programmed to its target state) to the time when its neighbors has finished programming. In this way, when the cell is being program-verified at its target state, it sees a first field environment due to its neighbors, and subsequently with the completion of programming of its neighbors, it see a second field environment, and the difference between these two field environment are minimized. The Yupin effect is a program disturb that affects adjacent cells along a row and across bit lines (BL-BL Yupin effect) and along a column across word lines (WL-WL Yupin effect) of a memory array.

One way to reduce BL-BL Yupin effect is to adopt a multi-pass programming scheme for programming a page of memory cells on a word line in parallel. In a first programming pass, the memory cells targeted to the more programmed states (ones that will have their threshold voltages moved from an erased state at a lower end of the threshold window to a higher end) are initially programmed to a staging area near halfway of the threshold window. In subsequent programming passes, they are programmed from the staging area to their final target destinations. In this way, the difference between the first and second field environment seen by a memory cell is due to the threshold voltages of its neighbors not moving across the full extent but at most across half of the threshold window.

A conventional method of implementing the above-mentioned multi-pass programming is performed a series of binary programming, in which at each programming pass the threshold window is binary divided and memory cells with target states belonging to the upper half of the binary divisions is programmed to the lower middle portion of the binary divisions. Each further programming pass iterates the binary division programming until in a final programming pass all memory cells of the page are programmed to their final destinations. A preferred coding that goes along with such programming scheme is given by the "LM" coding.

Single-Level (SLC) and Multi-Level (MLC) Memory Cells

As described earlier, an example of nonvolatile memory is formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. In SLC memory, each memory cell stores one bit of data. In MLC memory, each memory cell stores more than one bit of data.

Exemplary "LM" Coding for a 2-Bit or 4-State Memory

Figure 5:
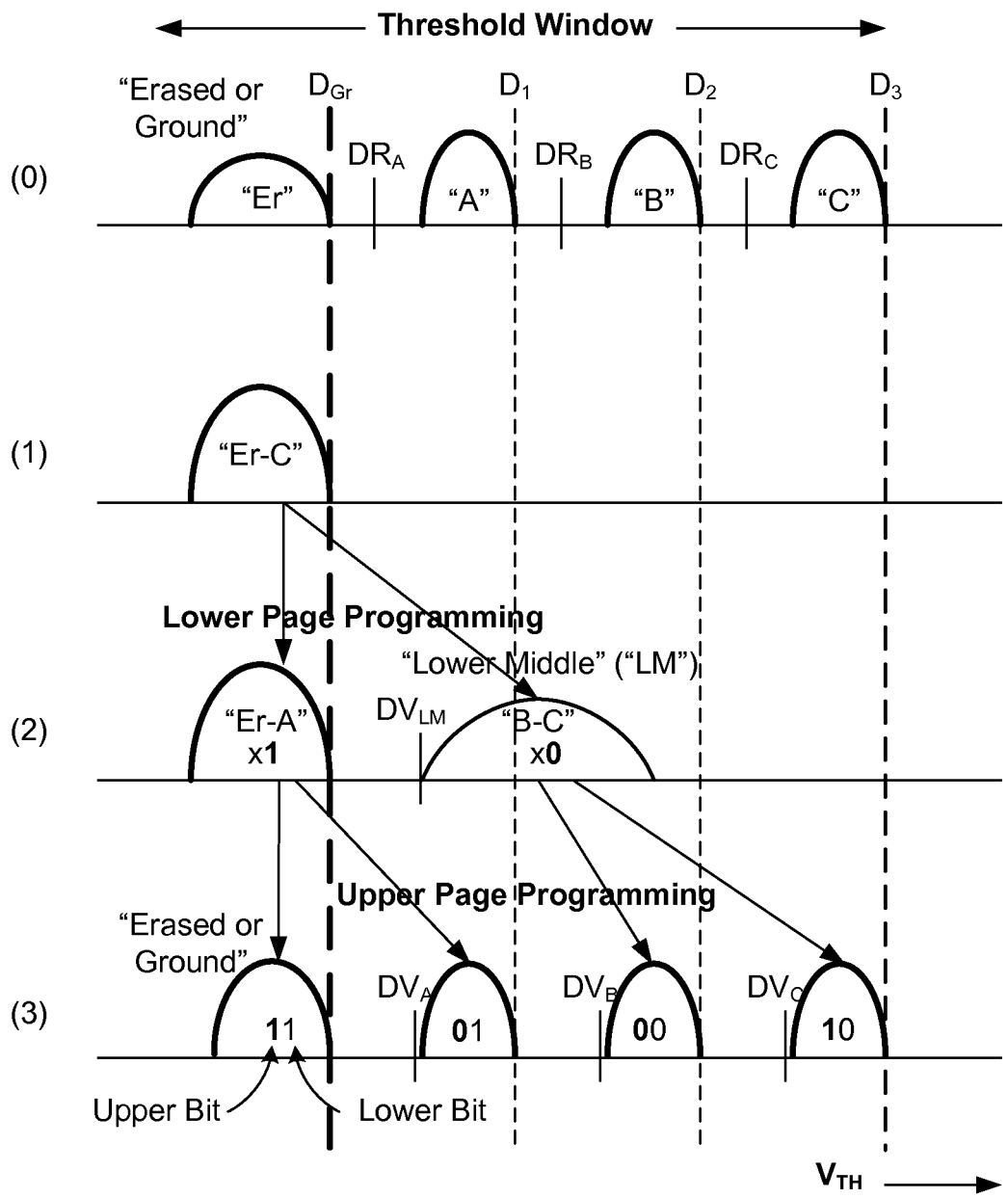
FIGS. 5(0)-5(3) illustrate a logical page by page programming of a 4-state memory encoded with a 2-bit logical code ("LM" code) according to the prior art.

FIGS. 5(0)-5(3) illustrate a logical page by page programming of a 4-state memory encoded with a 2-bit logical code ("LM" code) according to the prior art. The 2 code bits from each memory cell of a page form two logical pages with each page formed from one code bits contributed from every memory cells of the page. Programming can be performed logical-page by logical page with the lower page followed by the upper page. This code provides fault-tolerance and alleviates the BL-BL the Yupin Effect. FIG. 5(0) illustrates the threshold voltage distributions of a 4-state memory array. The possible threshold voltages of each memory cell spans a threshold window which is partitioned into four regions by demarcation threshold voltages $D_A$, $D_B$ and $D_C$ to demarcate respectively four possible memory states, "Er", "A", "B" and "C". "Er" is a ground state, which is an erased state within a tightened distribution and "A", "B" and "C" are three progressively programmed states. During read, the four states are demarcated by three read points, $DR_A$, $DR_B$ and $DR_C$.

FIG. 5(3) illustrates a preferred, 2-bit LM coding to represent the four possible memory states. Each of the memory states (viz., "Er", "A", "B" and "C") is represented by a pair of "upper, lower" code bits, namely "11", "01", "00" and "10" respectively. The LM coding differs from the conventional Gray code in that the upper and lower bits are reversed for states "A" and "C". The "LM" code has been disclosed in U.S. Pat. No. 6,657,891 and is advantageous in reducing the field-effect coupling between adjacent floating gates by avoiding program operations that require a large change in charges. As will be seen in FIGS. 5(2) and 5(3), each programming operation results in moderate change of the charges in the charge storage unit as evident from the moderate change in the threshold voltages $V_T$.

The coding is designed such that the 2 code bits, "lower" and "upper" bits, may be programmed and read separately. When programming the lower bit, the threshold level of the cell either remains in the "erased" region or is moved to a "lower middle" region of the threshold window. When programming the upper bit, the threshold level of a cell in either of these two regions is further advanced to a slightly higher level in a "lower intermediate" region of the threshold window.

FIGS. 5(1) and 5(2) illustrate the lower page programming using the 2-bit LM code. The fault-tolerant LM code is designed to avoid any subsequent upper page programming to transit through any intermediate states. Thus, the first round, lower page programming has a cell remain in the "erased" or "Er" state if the lower bit is "1" or programmed to a "lower intermediate" state if the lower bit is "0". Basically, the "Er" or "ground" state is the "erased" state with a tightened distribution by having the deeply erased states programmed to within a well-defined range of threshold values. The lower page LM programming essentially has the memory cells targeted to states "B" and "C" in the upper half of the threshold window programming to an intermediate staging area near the middle of the threshold window. The "lower intermediate" ("LM") states may have a broad distribution of threshold voltages that straddle between memory states "A" and "B". The programming is preferably performed with relatively few coarse pulses to move the memory cells designated for states "B" and "C" quickly to the LM state. The "LM" state is programmed verified in between programming pulses relative to a verify demarcation such as $DV_{LM}$ so that the LM state is as close to the demarcation $D_2$ between the states "B" and "C" but not exceeding it.

Essentially, the first pass programming has left untouched the memory cells targeted to states "E" and "A" belonging to the lower half of the threshold window and these memory cells remain in the erased band of the threshold window. At the same time, the programming moves the memory cells targeted to states "B" and C" belonging to the higher half of the threshold window to an LM staging area near the middle of the threshold window. In subsequent programming passes to complete the programming of the memory cells, the most each cell has to move to its final destination is half the width of the threshold window.

FIGS. 5(2) and 5(3) illustrate the upper page programming using the 2-bit LM code. The upper page programming is performed on the basis of the first pass, lower page programming. A given upper bit can represent different memory states depending on the value of the lower bit. In the second pass of programming, if a cell is to have the upper bit as "1" while the lower bit is at "1", i.e. (1,1), there is no programming for that cell and it remains in "Er". If the upper bit is "0" while the lower bit is at "1", i.e., (0,1), the cell is programmed from the "Er" state to the "A" state. During programming to "A", the verifying is relative to the demarcation $DV_A$. On the other hand, if the cell is to have the upper bit as "0" while the lower bit is at "0", i.e., (0,0), the cell is programmed from the "lower intermediate" state to "B". The program verifying is relative to a demarcation $DV_B$. Similarly, if the cell is to have the upper bit as "1" while the lower page is at "0", i.e., (1,0), the cell will be programmed from the "lower intermediate" state to "C". The program verifying is relative to a demarcation $DV_C$.

Since the upper page programming only involves programming to the next adjacent memory state from either the "Er" state or the "lower intermediate" state, no large amount of charges is altered from one round to another. Also, the lower page programming from "Er" to a rough "lower intermediate" state is designed to save time. In each programming pass, the increasing programming pulses are restarted and ramped up from an initial Vpgm0 (see FIG. 10.)

In another implementation, a "Quick Pass Write" programming technique is implemented. Whenever programming of a cell approaches close to a verification demarcation point, the programming will be switched to a slower (i.e. finer) mode by suitable biasing of the bit line voltage or by modifying the programming pulses. In this way, larger programming steps can be used initially for rapid convergence without the danger of overshooting the target state. "QPW" programming algorithm has been disclosed in U.S. patent application Ser. No. 11/323,596, filed Dec. 29, 2005 and entitled, "Methods for Improved Program-Verify Operations in Non-Volatile Memories," the entire disclosure of which is hereby incorporated herein by reference.

Exemplary "LM" Coding for a 3-Bit or 8-State Memory

The example for the 2-bit LM code can be similarly extended to 3-bit or high number of bits.

Figure 6:
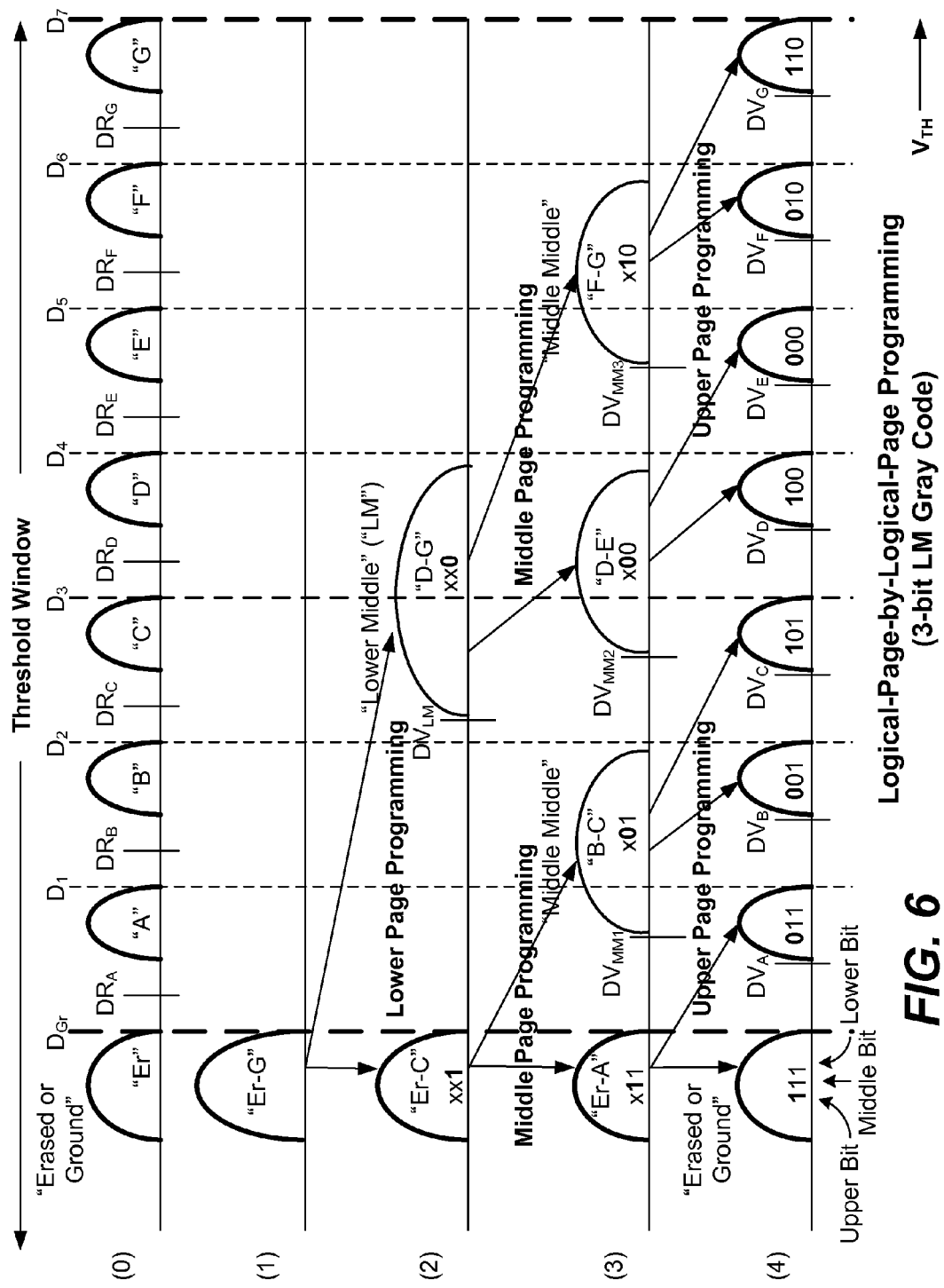
FIGS. 6(0)-6(4) illustrate the programming of an 8-state memory encoded with a preferred 3-bit logical code ("LM" code) according to the prior art.

FIGS. 6(0)-6(4) illustrate the programming of an 8-state memory encoded with a preferred 3-bit logical code ("LM" code) according to the prior art. The 3 bits from each memory cell of a page forms three logical pages and programming can be performed logical-page by logical page. This code is similar to the 2-bit LM coding described earlier and is an extension into 3 bits to encode eight possible memory states. FIG. 6(0) illustrates the threshold voltage distributions of an 8-state memory array. The possible threshold voltages of each memory cell spans a threshold window which is partitioned into eight regions by demarcation threshold voltage points $D_A$-$D_G$ to demarcate respectively eight possible memory states, "Er", "A", "B", "C", "D", "E", "F" and "G". "Er" is a ground state, which is an erased state within a tightened distribution and "A"-"G" are seven progressively programmed states. During read, the eight states are demarcated by seven demarcation read points, $DR_A$-$DR_G$.

FIG. 6(4) illustrates a 3-bit LM coding to represent the eight possible memory states. Each of the eight memory states is represented by a triplet of "upper, middle, lower" bits, namely "111", "011", "001", "101", "100", "000", "010" and "110" respectively. As is evident from FIG. 8(4), the final programming pass results in only a small change in the threshold voltages of all the memory cells. This translates to small changes in the charge storage unit of each memory cells, thereby minimizing the Yupin effect.

The coding is designed such that the 3 code bits, "lower", "middle" and "upper" bits, may be programmed and read separately. Thus, the first round, lower page programming has a cell remain in the "erased" or "Er" state if the lower bit is "1" or programmed to a "lower intermediate" state if the lower bit is "0". Basically, the "Er" or "ground" state is the "erased" state with a tightened distribution by having the deeply erased states programmed to within a narrow range of threshold values. The "lower intermediate" states may have a broad distribution of threshold voltages that straddling between memory states "B" and "D". During programming, the "lower intermediate" state can be verified relative to a coarse breakpoint threshold level such as $D_B$. When programming the middle bit, the threshold level of a cell will start from one of the two regions resulted from the lower page programming and move to one of four possible regions. When programming the upper bit, the threshold level of a cell will start from one of the four possible regions resulted from the middle page programming and move to one of eight possible memory states.

In general a page of memory cells is being programmed in parallel, with each memory cell having 3 bits. Thus, the page of memory cells may be regarded as having 3 logical data pages with each logical data page contributed from one code bit of every cells of the page. Thus, a "lower bit" page is formed from the lower bit of every memory cells of the page, a "middle bit" page is formed from the middle bit of every cell and an "upper bit" page is formed from the upper bit of every cell of the page.

FIGS. 6(1) and 6(2) illustrate the lower page programming using the 3-bit LM code. The fault-tolerant LM code is designed to avoid any subsequent higher page programming to transit through any intermediate states. Thus, the first round, lower page programming has a cell remain in the "erased" or "Er" state if the lower bit is "1", i.e. (x,x,1) or programmed to a "lower intermediate" state if the lower bit is "0", i.e., (x,x,0). Basically, the "Er" or "ground" state is the "erased" state with a tightened distribution by having the deeply erased states programmed to within a well-defined range of threshold values. The lower page LM programming essentially has the memory cells targeted to states "D"-"G" in the upper half of the threshold window programming to an intermediate staging area near the middle of the threshold window. The "lower intermediate" ("LM") states may have a broad distribution of threshold voltages that straddling between memory states "B" and "D". The programming is preferably performed with relatively few coarse pulses to move the memory cells designated for states "B" and "C" quickly to the LM state. The "LM" state is programmed verified in between programming pulses relative to a verify demarcation such as $DV_{LM}$ so that the LM state is as close to the demarcation $D_4$ between the states "D" and "E" but not exceeding it.

Essentially, the first pass programming has left untouched the memory cells targeted to states "E"-"C" belonging to the lower half of the threshold window and these memory cells remain in the erased band of the threshold window. At the same time, the programming moves the memory cells targeted to states "D"-"G" belonging to the higher half of the threshold window to an LM staging area near the middle of the threshold window. In subsequent programming passes to complete the programming of the memory cells, the most each cell has to move to its final destination is half the width of the threshold window.

FIGS. 6(2) and 6(3) illustrate the middle page programming using the 3-bit LM code. The middle page programming is performed on the basis of the first round, lower page programming. A given middle bit can represent different memory states depending on the lower bit. In the second round of programming, if a cell is to have the middle bit as "1" while the lower bit is at "1", i.e. (x,1,1), there is no programming for that cell and it remains in "Er". If the middle bit is "0" while the lower bit is at "1", i.e., (x,0,1), the cell is programmed from the "Er" state to a first "middle middle" state straddling between "A" and "B". During programming to the first "middle middle" state, the verifying is relative to the demarcation $DV_{MM1}$. On the other hand, if the cell is to have the middle bit as "0" while the lower bit is at "0", i.e., (x,0,0), the cell is programmed from the "LM" state to a second "middle middle" state straddling between "C" and "D". The program verifying is relative to a demarcation $DV_{MM2}$. Similarly, if the cell is to have the middle bit as "1" while the lower page is at "0", i.e., (x,1,0), the cell will be programmed from the "LM" state to a third "middle intermediate" state straddling between "E" and "F". The program verifying is relative to a demarcation $DV_{MM3}$.

FIGS. 6(3) and 6(4) illustrate the upper page programming using the 3-bit LM code. The upper page programming is performed on the basis of the first and second rounds, namely the lower and middle page programming. A given upper bit can represent different memory states depending on the lower and middle bits. In the third round of programming, if a cell is to have the upper bit as "1" while the lower and middle bits are at "1", i.e. (1,1,1), there is no programming for that cell and it remains in "Er". On the other hand, if the upper bit is "0" while the lower and middle bits are at "1", i.e. (0,1,1), the cell is programmed from the "Er" state to the "A" state. During programming to "A", the verifying is relative to the demarcation $DV_A$.

Similarly, if the cell is to have the upper bit as "0" while the lower bit and middle bits are at "0" and "1" respectively, i.e. (0,0,1), the cell is programmed from the first "middle intermediate" state to "B". The program verifying is relative to a demarcation $DV_B$. If the cell is to have the upper bit as "1" while the lower bit and middle bits are at "0" and "1" respectively, i.e. (1,0,1), the cell is programmed from the first "middle intermediate" state to "C". The program verifying is relative to a demarcation $DV_C$.

Similarly, if the cell is to have the upper bit as "1" while the lower bit and middle bits are at "0" and "0" respectively, i.e. (1,0,0), the cell is programmed from the second "middle intermediate" state to "D". The program verifying is relative to a demarcation $DV_D$. If the cell is to have the upper bit as "0" while the lower bit and middle bits are at "0" and "0" respectively, i.e. (0,0,0), the cell is programmed from the second "middle intermediate" state to "E". The program verifying is relative to a demarcation $DV_E$.

Similarly, if the cell is to have the upper bit as "0" while the lower bit and middle bits are at "1" and "0" respectively, i.e. (0,1,0), the cell is programmed from the third "middle intermediate" state to "F". The program verifying is relative to a demarcation $DV_F$. If the cell is to have the upper bit as "1" while the lower bit and middle bits are at "0" and "0" respectively, i.e. (1,1,0), the cell is programmed from the third "middle intermediate" state to "G". The program verifying is relative to a demarcation $DV_G$.

Since the upper page programming only involves programming to the next adjacent memory state from either the "Er" state or one of the "middle intermediate" states, no large amount of charges is altered from one round to another. This helps to alleviates BL-BL Yupin effect.

As for 4-bit, 5-bit and higher bit LM coding, the same principle applies where an n-bit code would have n data pages with each page formed from every cell in a page contributing a given bit of the code. More importantly, programming from a lower to a higher bit page incurs moderate change in the charge of the cells, thereby limiting the amount of perturbation due to the Yupin effect among a page of memory cells.

Exemplary "LM-Foggy-Fine" Programming for a 3-Bit or 8-State Memory

The 3-bit LM coding and programming described in FIG. 6 can be implemented with programming a logical page at a time with each programming pass. There are three logical pages: lower page, middle page and upper page corresponding to the lower, middle and upper bits.

An alternative programming scheme is to keep the first pass LM programming as in FIG. 6 to program the lower logical page. However, the second pass will no longer program the memory cells to binary divided staging areas, but simply program all the memory cells close to their destinations. The second pass programming is referred to as "foggy" as it is still performed coarsely with coarse programming pulses to increase speed, but finer than that of the first LM pass. This is followed by a third "fine" programming pass which trims the trailing edge of the threshold distribution of each state using still finer programming pulses. The verify threshold points for each pass is dependent on the granularity of the programming pulses. Each placement is such that a memory cell will first be verified at the verify threshold before it get over-programmed to a designated threshold value.

Figure 7:
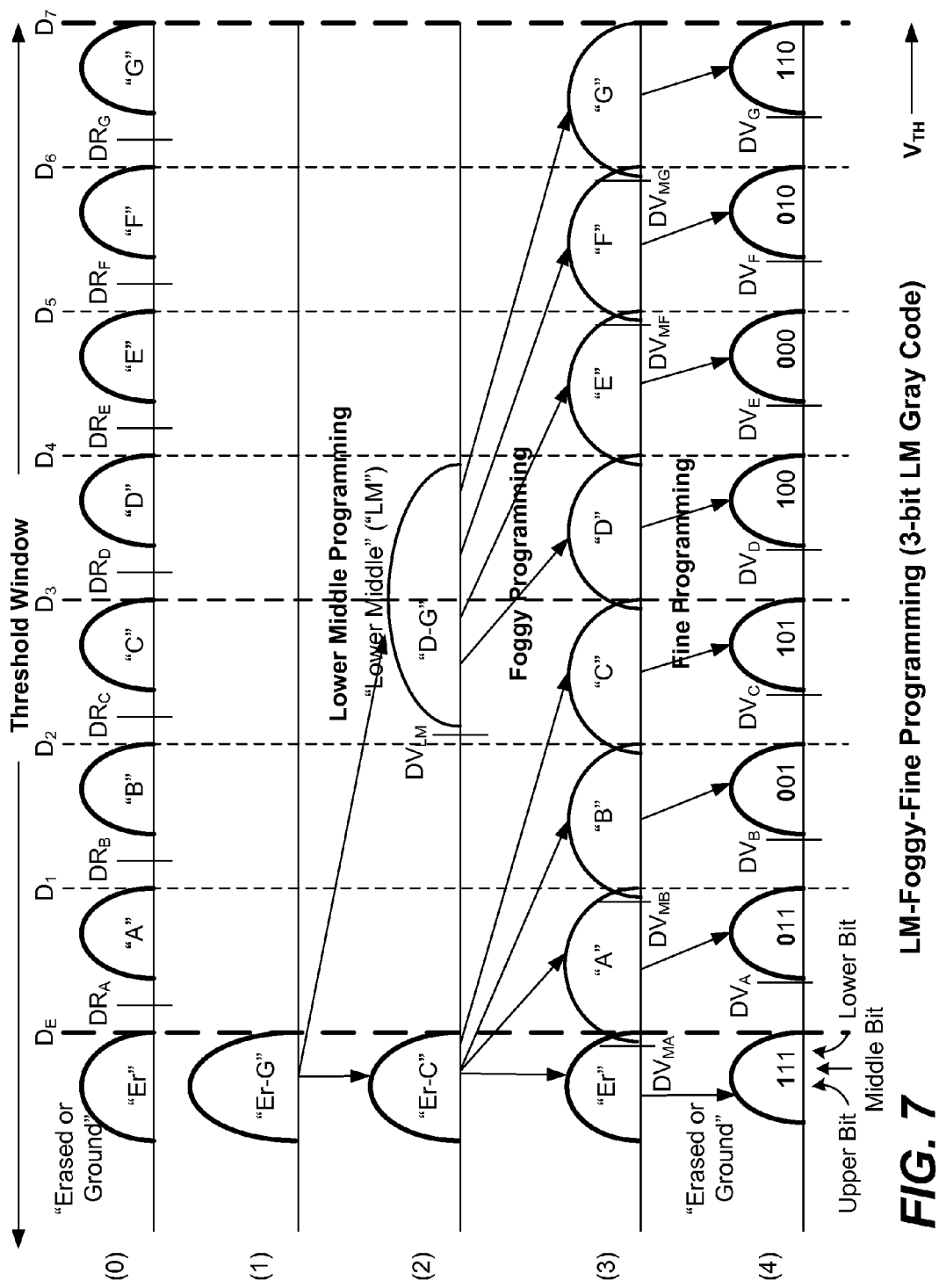
FIGS. 7(0)-7(4) illustrate a "LM-Foggy-Fine" programming scheme as in the prior art.

FIGS. 7(0)-7(4) illustrate a "LM-Foggy-Fine" programming scheme as in the prior art.

FIG. 7(1)-FIG. 7(2) illustrate the "LM" pass similar to that shown in FIG. 6(1) to FIG. 6(2). The LM pass programs the lower logical page as before.

FIGS. 7(2)-7(3) illustrate a "foggy" pass in which all memory cells are relatively roughly and quickly programmed toward their target states using finer programming pulses.

FIGS. 7(3)-7(4) illustrate a "fine" pass in which all memory cells are finally programmed to their target states using even finer programming pulses.

Improved "LM" Programming with Memory Cells Programmed Closer to their Final Destinations As is clear from the examples given for the 2-bit and 3-bit multi-pass programming, initially an LM programming pass serves to dump the memory cells targeted to higher programmed states to the "LM" staging area near the lower middle portion of the threshold window. In the 2-bit case, the memory cells targeted to "B" and "C" are deposited to the staging area by program-verifying them at $DV_{LM}$. In the 3-bit case, the memory cells targeted to "D"-"G" are deposited to the staging area by program-verifying them at $DV_{LM}$. While these memory cells are selected for programming based on their targeted states belonging to the upper half of the threshold window, no distinctions are made between the different states when performing the program verify. Since they are all deposited in the same staging area relative to $DV_{LM}$ regardless of the target states, when subsequent programming passes move these memory cells to their final destinations, the ones targeted to more programmed states have no head start and will need to take more programming pulses in order to reach their final destinations.

According to a first embodiment of the invention, a page of memory cells operating within a common threshold voltage window is programmed by an improved multi-pass programming operation. The multi-pass programming includes a first "Improved LM" programming pass which comprises selecting a first set of memory cells of the page with target states in an upper half of the threshold window for programming, programming and verifying each memory cell of the first set with programming voltage pulse by pulse until said each memory cell has been verified to have passed a predetermined verify point near a middle portion of the threshold window, and after all memory cells of the first set have been program-verified, further enabling the program-verified memory cells to a number of additional programming pulses without intervening verify, the number being dependent on the target state. The Improved LM pass is followed by one or more programming passes in which all memory cells of the page are more finely programmed to their final destinations.

In this way, the improved LM pass programs each memory cell closer to its final destination compared to conventional LM programming pass implementations. This will reduce the programming needed in subsequent passes, thereby improving performance. Overall time is saved as it is faster to move the memory cell in the threshold window during the improved LM pass than in subsequent passes because of the more efficient, coarser programming pulses and the absence of intervening verify operations.

Figure 8:
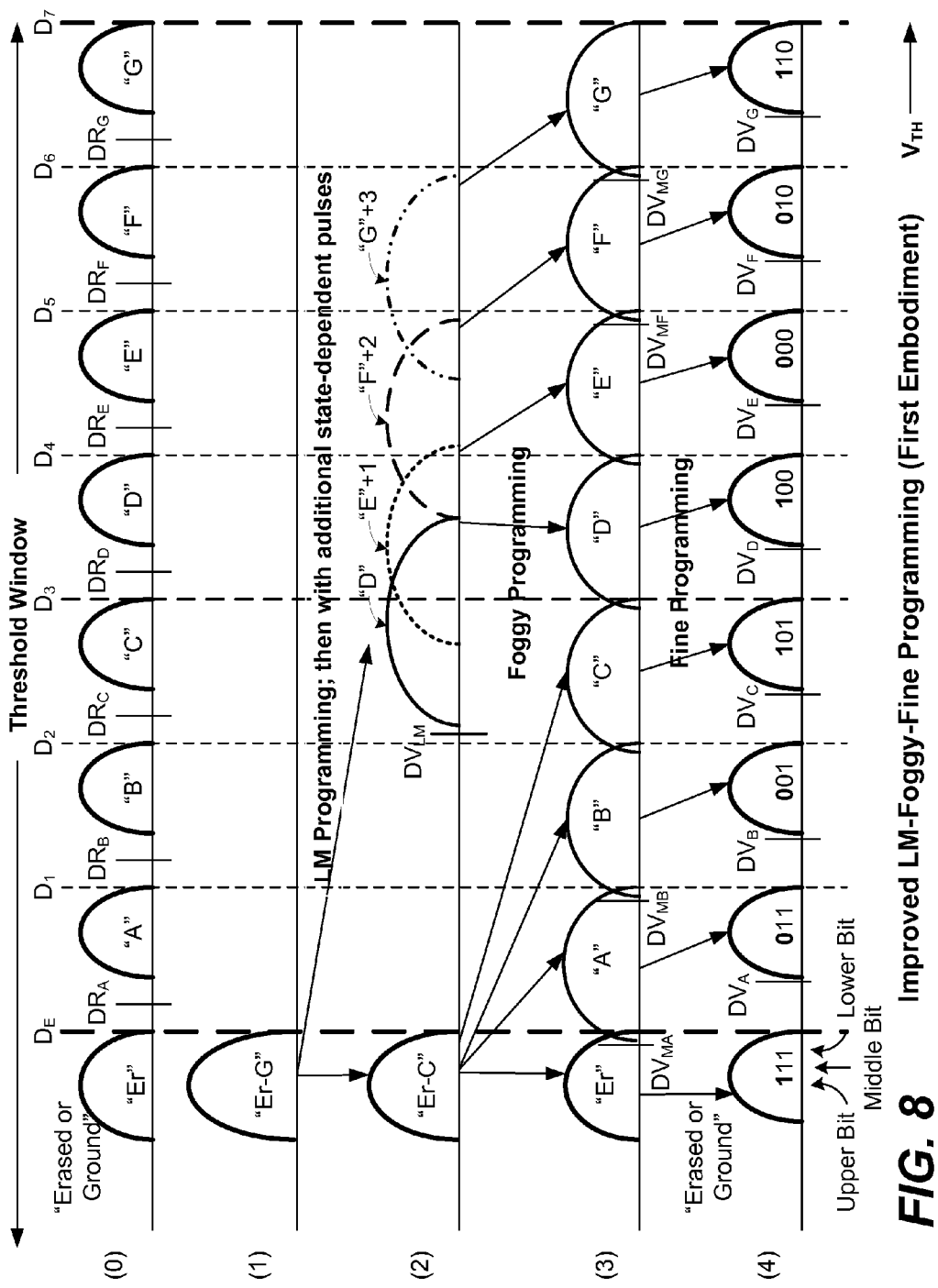
FIGS. 8(0)-8(4) illustrate an improved multi-pass programming on a page of 3-bit memory cells having a first programming as an improved LM pass according to the first embodiment of the invention.

FIGS. 8(0)-8(4) illustrate an improved multi-pass programming on a page of 3-bit memory cells having a first programming as an improved LM pass according to the first embodiment of the invention.

FIG. 8(0) illustrates the threshold voltage distributions of an 8-state memory array. The possible threshold voltages of each memory cell spans a threshold window which is partitioned into eight regions by demarcation threshold voltage points $D_A$-$D_G$ to demarcate respectively eight possible memory states, "Er", "A", "B", "C", "D", "E", "F" and "G". "Er" is a ground state, which is an erased state within a tightened distribution and "A"-"G" are seven progressively programmed states. During read, the eight states are demarcated by seven demarcation read points, $DR_A$-$DR_G$.

FIG. 8(4) illustrates a 3-bit LM coding to represent the eight possible memory states. Each of the eight memory states is represented by a triplet of "upper, middle, lower" bits, namely "111", "011", "001", "101", "100", "000", "010" and "110" respectively. As is evident from FIG. 8(4), the final programming pass results in only a small change in the threshold voltages of all the memory cells. This translates to small changes in the charge storage unit of each memory cells, thereby minimizing the Yupin effect.

FIGS. 8(1)-8(2) illustrate the first programming pass, referred to as the "improved LM pass". The improved LM pass is initially similar to the lower page LM programming shown in FIGS. 5(1)-5(2) and FIGS. 6(1)-6(2). The 3-bit memory cells of the page to be programmed have target states among $2^N$=k+1 possible memory states. When N=3, the number of possible memory states is 8 and with one erased state, the number of programmed states is k=7. Thus, the 8 memory states range from "Er" at the lowest end to "G" at the highest end of the threshold window. The states "Er", "A", "B" and "C" reside in the lower half of the threshold window and the states "D", "E", "F", "G" reside in the upper half of the threshold window. A first set of memory cells with target states among states "D"-"G" in the upper half of the threshold window is selected for programming to a lower intermediate staging area near the middle of the threshold window. The "lower intermediate" ("LM") staging area may have a broad distribution of threshold voltages that straddling between memory states "C" and "D" but not exceeding state "D". The programming is preferably performed with relatively few coarse pulses to move the memory cells designated for states "D"-"G" quickly to the LM staging area. This is accomplished by program-verifying in between programming pulses relative to a predetermined verify demarcation $DV_{LM}$ so that the memory cells moved to the LM staging area are as close to the demarcation $D_4$ between the states "D" and "E" as possible but not exceeding it.

Essentially, the first pass programming has left untouched the memory cells targeted to states "Er"-"C" belonging to the lower half of the threshold window and these memory cells remain in the erased band of the threshold window. At the same time, the programming moves the memory cells targeted to states "D"-"G" belonging to the higher half of the threshold window to an LM staging area near the middle of the threshold window.

Typically, each program pulse in the conventional LM pass is set to advance the memory cell by one programmed state. Thus, the conventional LM pass will typically be completed after 4 pulses where the first set of memory cells will be programmed up to but not exceeding the state "D".

The improved LM pass has additional programming after the conventional LM pass has been completed. If the memory cell in the staging area is targeted to state "D", it will not be program-enabled to any additional pulses as it is already program-verified at its final destination. However, for the memory cell in the stage targeted to state "E", it is only program-verified at state "D" short of "E". So for example it will be program-enabled to be programmed by 1 additional pulse. Similarly, for memory cells respectively targeted to states "F" and "G", they will be program-enabled to be programmed by 2 and 3 additional pulses respectively.

FIG. 8(2) illustrate the distribution of memory cells with target states "D", "E", "F" and "G" being extended after the additional programming. "E"+1 denotes memory cells with target state "E" enabled for 1 additional program pulse, "F"+2 denotes memory cells with target state "F" enabled for 2 additional program pulses and "G"+3 denotes memory cells with target state "G" enabled for 3 additional program pulses.

The additional programming incurs 3 additional pulses after the completion of the conventional LM pass, but does not require intervening verify. The advantage is that the memory cells are staged closer to their final destinations, thereby saving time in the subsequent programming passes.

FIG. 8(3) illustrates a second programming pass similar to the "foggy" pass described in connection with FIG. 7(3).

FIG. 8(4) illustrates a third programming pass similar to the "fine" pass described in connection with FIG. 7(3).

With each subsequent programming pass, a finer programming pulse and a more restrictive set of verify threshold voltage points are used to improve the resolution of the programming.

According to a second embodiment of the invention, a page of memory cells operating within a common threshold voltage window is programmed by an improved multi-pass programming operation. The multi-pass programming includes a first "Improved LM" programming pass which comprises selecting a first set of memory cells of the page with target states in an upper half of the threshold window for programming, programming and verifying each memory cell of the first set with programming voltage pulse by pulse until said each memory cell has been verified to have passed a predetermined verify point near a middle portion of the threshold window, and while the programming and verifying is ongoing for remaining memory cells of the first set that have yet to be program-verified at the predetermined verify point, the program-verified memory cells are further program-enabled to a number of on-going programming pulses without intervening verify on the program-verified memory cells, the number being dependent on the target state. The Improved LM pass is followed by one or more programming passes in which all memory cells of the page are more finely programmed to their final destinations.

In particular, when the memory has a target state of a more programmed state or higher up the threshold window relative to the staging area, the larger is the number of additional programming pulses it will receive, but limited by the availability of the ongoing programming pulse. For example, it may take up to 4 pulses to program-verified all memory cells of the first set. If a memory state passes the verify point in the pulse 2, and it has target state "D" it will be program-inhibited in pulse 3 and 4. On the other hand, if the memory state has target state "E", it will be program-enabled in pulse 3, but not pulse 4. If the memory state has target state "F", it will be program-enabled in pulse 3 and pulse 4. If the memory state has target state "G", it will be program-enable in pulse 3 and pulse 4.

The second embodiment, similar to the first embodiment, of the improved LM pass programs each memory cells closer to its final destination compared to previous LM programming pass implementations. This will reduce the programming needed in subsequent passes, thereby improving performance. Overall time is saved because, it is faster to move the memory cell in the threshold window during the improved LM pass than in subsequent passes because the additional programming pulses incurred in the improved LM pass is more efficient due to coarser programming pulses and the absence of intervening verify operations. In particular, the second embodiment operates only within the ongoing number of programming pulses needed to program-verify all memory cells of the first set, and not additional ones.

Figure 9:
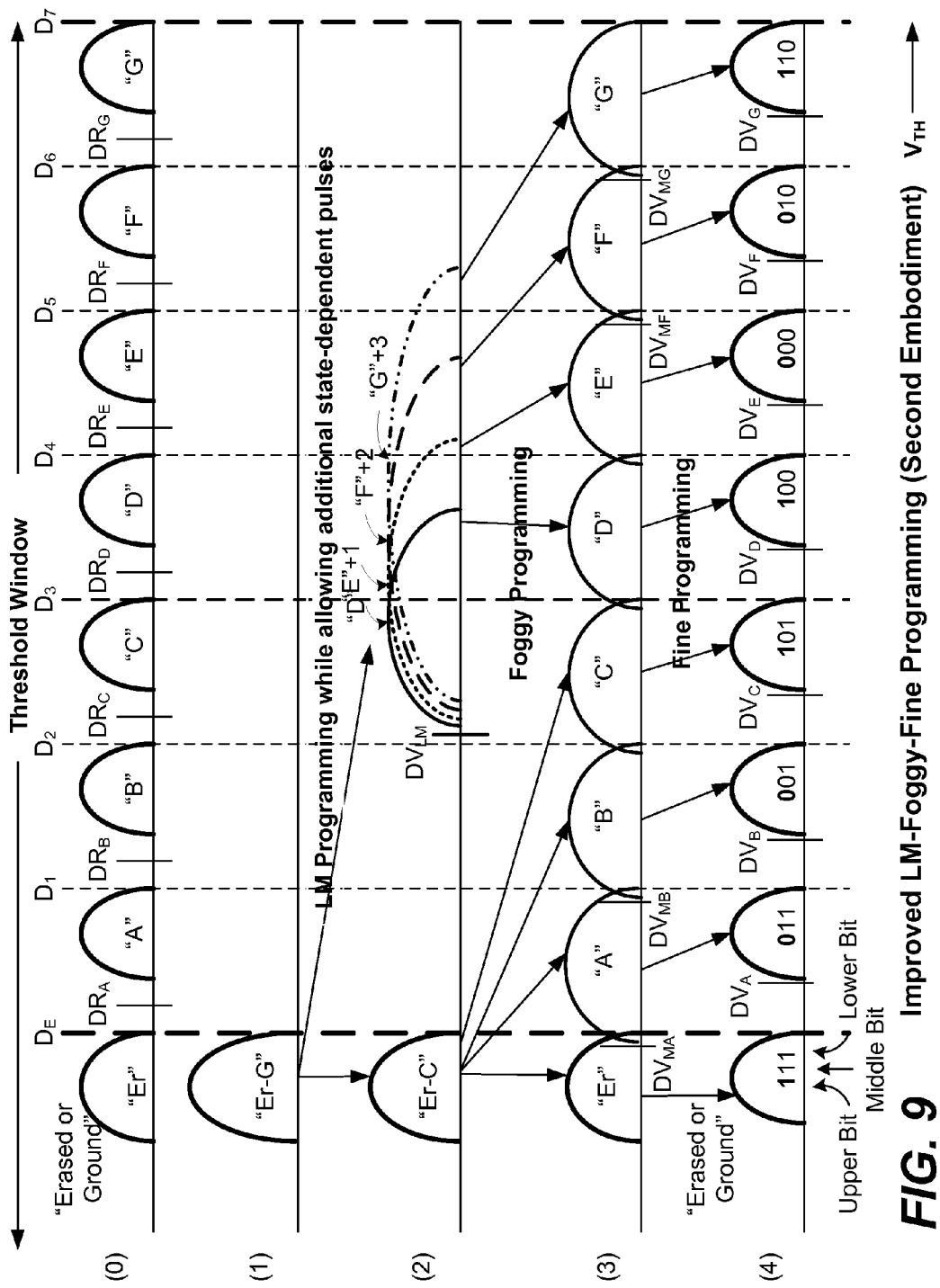
FIGS. 9(0)-9(4) illustrate an improved multi-pass programming on a page of 3-bit memory cells having a first programming as an improved LM pass according to the second embodiment of the invention.

FIGS. 9(0)-9(4) illustrate an improved multi-pass programming on a page of 3-bit memory cells having a first programming as an improved LM pass according to the second embodiment of the invention. The second embodiment differs from the first embodiment in the manner the improved LM pass (first pass) is implemented.

FIGS. 9(1)-9(2) illustrate the first programming pass, referred to as the "improved LM pass". The improved LM pass is initially similar to the lower page LM programming shown in FIGS. 5(1)-5(2) and FIGS. 6(1)-6(2). The 3-bit memory cells of the page to be programmed have target states among $2^N=k+1$ possible memory states. When N=3, the number of possible memory states is 8 and with one erased state, the number of programmed states is k=7. Thus, the 8 memory states range from "Er" at the lowest end to "G" at the highest end of the threshold window. The states "Er", "A", "B" and "C" reside in the lower half of the threshold window and the states "D", "E", "F", "G" reside in the upper half of the threshold window. A first set of memory cells with target states among states "D"-"G" in the upper half of the threshold window is selected for programming to a lower intermediate staging area near the middle of the threshold window. The "lower intermediate" ("LM") staging area may have a broad distribution of threshold voltages that straddling between memory states "C" and "D" but not exceeding state "D". The programming is preferably performed with relatively few coarse pulses to move the memory cells designated for states "D"-"G" quickly to the LM staging area. This is accomplished by program-verifying in between programming pulses relative to a predetermined verify demarcation $DV_{LM}$ so that the memory cells moved to the LM staging area are as close to the demarcation $D_4$ between the states "D" and "E" as possible but not exceeding it.

Typically, each program pulse in the conventional LM pass is set to advance the memory cell by one programmed state. Thus, the conventional LM pass will typically be completed after 4 pulses where the first set of memory cells will be programmed up to but not exceeding the state "D".

The improved LM pass does not incur additional programming after the conventional LM pass has been completed. Instead, it only exposes the memory cells targeted to the higher programmed states, (e.g., "E"-"G") to additional pulses if the conventional LM pass is still ongoing. If the memory cell in the staging area (i.e., program-verified at "D") is targeted to state "D", it will be program-inhibited (not program-enabled) to any ongoing pulses as it is already program-verified at its final destination. However, for the memory cell in the staging area (i.e., program-verified at "D") that is targeted to state "E", it will not be program-inhibited (or be program-enabled) to any 1 additional ongoing pulse. Similarly, for memory cells respectively targeted to states "F" and "G", they will be program-enabled to any 2 and 3 additional ongoing pulses respectively.

FIG. 9(2) illustrate the distribution of memory cells with target states "D", "E", "F" and "G" being extended after the additional programming. "E"+1 denotes memory cells with target state "E" enabled for 1 additional ongoing program pulse if any, "F"+2 denotes memory cells with target state "F" enabled for 2 additional program pulses if any, and "G"+3 denotes memory cells with target state "G" enabled for 3 additional program pulses if any.

Figure 10:
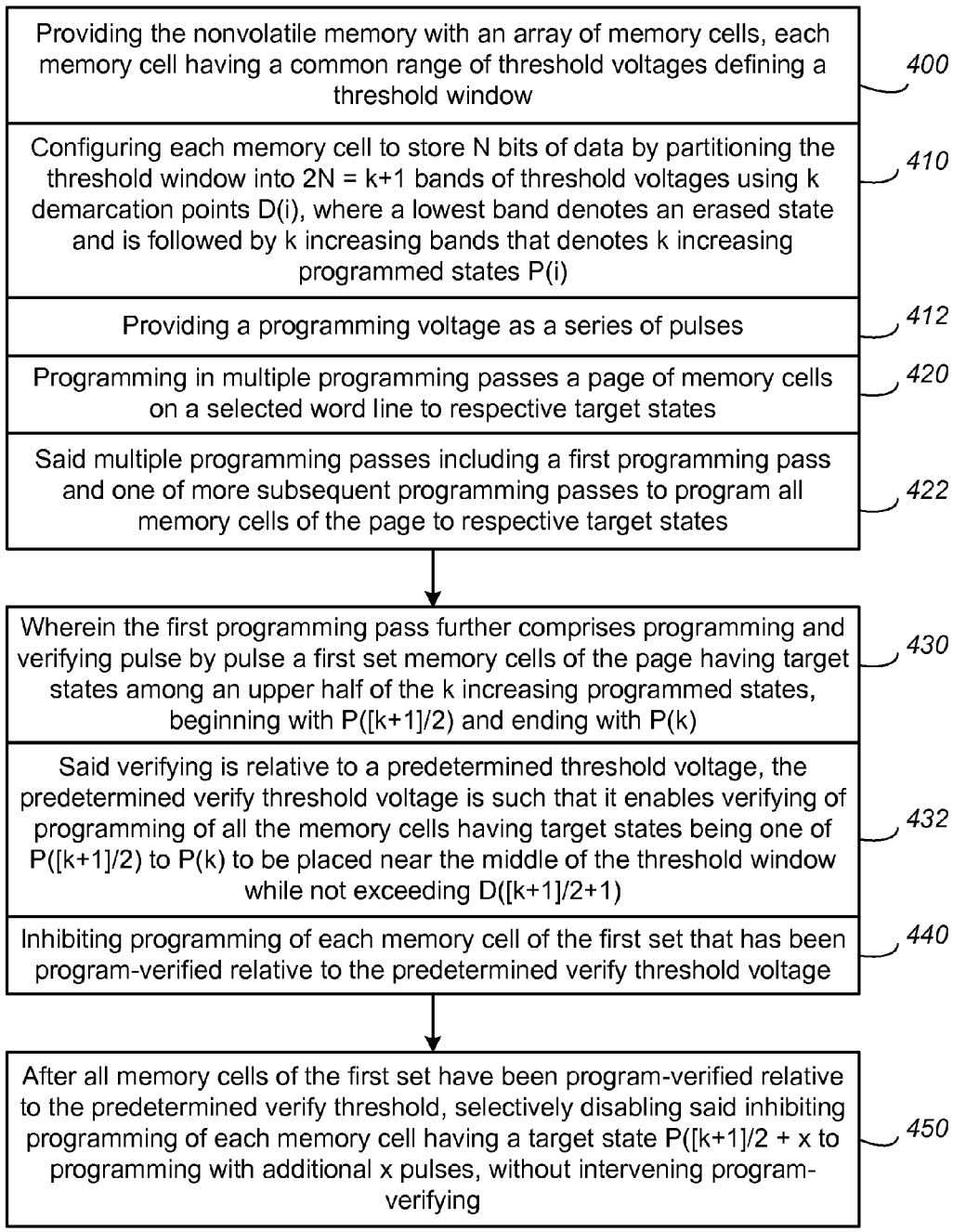
FIG. 10 is a flow diagram illustrating the multiple pass programming with the improved LM pass, according to the first embodiment.

FIG. 10 is a flow diagram illustrating the multiple pass programming with the improved LM pass, according to the first embodiment.

STEP 400: Providing the nonvolatile memory with an array of memory cells, each memory cell having a common range of threshold voltages defining a threshold window.

STEP 410: Configuring each memory cell to store N bits of data by partitioning the threshold window into $2N=k+1$ bands of threshold voltages using k demarcation points D(i), where a lowest band denotes an erased state and is followed by k increasing bands that denotes k increasing programmed states P(i).

STEP 412: Providing a programming voltage as a series of pulses.

STEP 420: Programming in multiple programming passes a page of memory cells on a selected word line to respective target states.

STEP 422: Said multiple programming passes including a first programming pass and one of more subsequent programming passes to program all memory cells of the page to respective target states.

STEP 430: Wherein the first programming pass further comprises programming and verifying pulse by pulse a first set memory cells of the page having target states among an upper half of the k increasing programmed states, beginning with P([k+1]/2) and ending with P(k).

STEP 432: Said verifying is relative to a predetermined threshold voltage, the predetermined verify threshold voltage is such that it enables verifying of programming of all the memory cells having target states being one of P([k+1]/2) to P(k) to be placed near the middle of the threshold window while not exceeding D([k+1]/2+1).

STEP 440: Inhibiting programming of each memory cell of the first set that has been program-verified relative to the predetermined verify threshold voltage.

STEP 450: After all memory cells of the first set have been program-verified relative to the predetermined verify threshold, selectively disabling said inhibiting programming of each memory cell having a target state P([k+1]/2+x to programming with additional x pulses, without intervening program-verifying.

Figure 11:
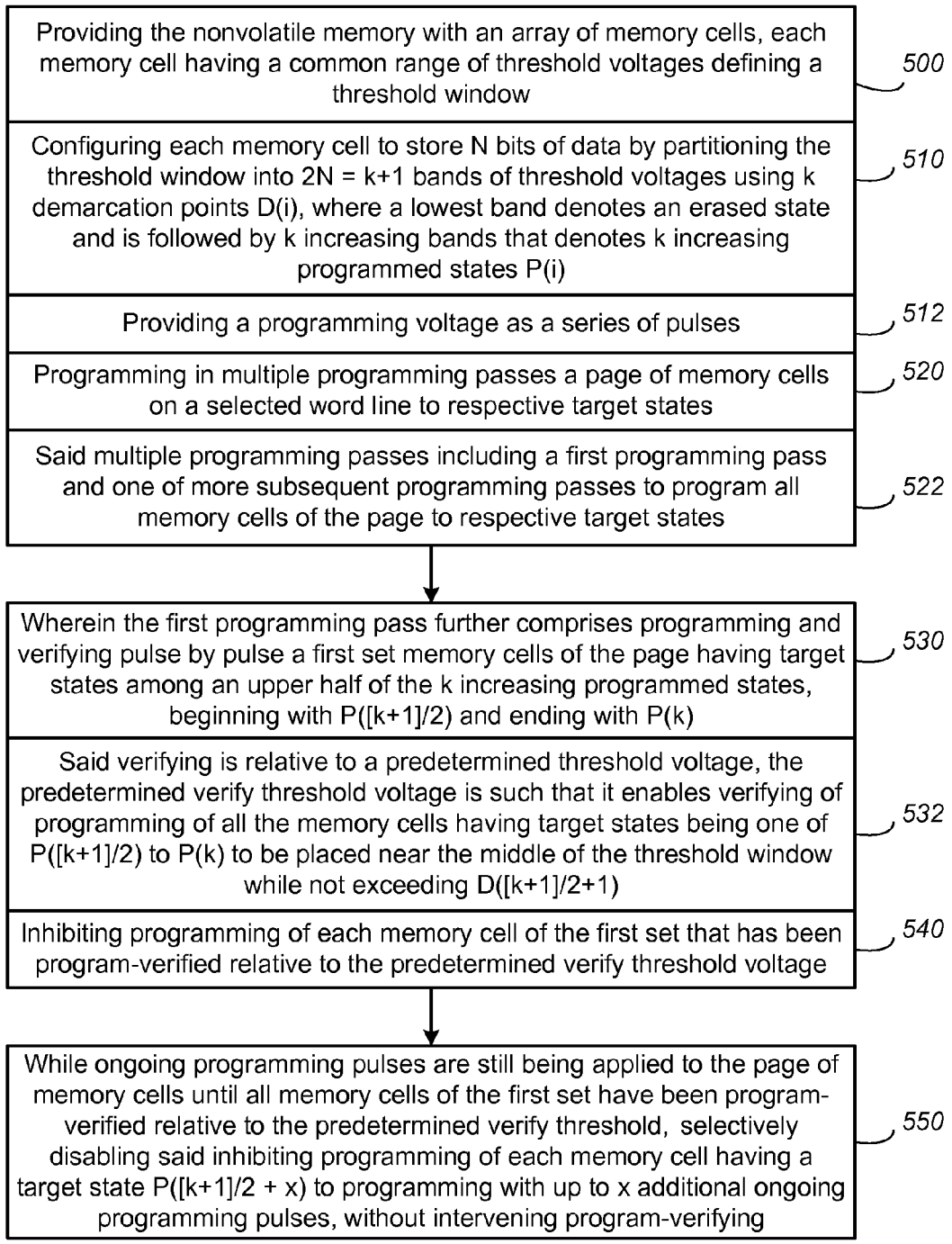
FIG. 11 is a flow diagram illustrating the multiple pass programming with the improved LM pass, according to the second embodiment.

FIG. 11 is a flow diagram illustrating the multiple pass programming with the improved LM pass, according to the second embodiment.

STEP 500: Providing the nonvolatile memory with an array of memory cells, each memory cell having a common range of threshold voltages defining a threshold window.

STEP 510: Configuring each memory cell to store N bits of data by partitioning the threshold window into 2N=k+1 bands of threshold voltages using k demarcation points D(i), where a lowest band denotes an erased state and is followed by k increasing bands that denotes k increasing programmed states P(i).

STEP 512: Providing a programming voltage as a series of pulses.

STEP 520: Programming in multiple programming passes a page of memory cells on a selected word line to respective target states.

STEP 522: Said multiple programming passes including a first programming pass and one of more subsequent programming passes to program all memory cells of the page to respective target states.

STEP 530: Wherein the first programming pass further comprises programming and verifying pulse by pulse a first set memory cells of the page having target states among an upper half of the k increasing programmed states, beginning with P([k+1]/2) and ending with P(k).

STEP 532: Said verifying is relative to a predetermined threshold voltage, the predetermined verify threshold voltage is such that it enables verifying of programming of all the memory cells having target states being one of P([k+1]/2) to P(k) to be placed near the middle of the threshold window while not exceeding D([k+1]/2+1).

STEP 540: Inhibiting programming of each memory cell of the first set that has been program-verified relative to the predetermined verify threshold voltage.

STEP 550: While ongoing programming pulses are still being applied to the page of memory cells until all memory cells of the first set have been program-verified relative to the predetermined verify threshold, selectively disabling said inhibiting programming of each memory cell having a target state P([k+1]/2+x) to programming with up to x additional ongoing programming pulses, without intervening program-verifying.

While the embodiments of this invention that have been described are the preferred implementations, those skilled in the art will understand that variations thereof may also be possible. Therefore, the invention is entitled to protection within the full scope of the appended claims.

It is claimed:

1. A method of programming a nonvolatile memory, comprising:
    providing the nonvolatile memory with an array of memory cells, each memory cell having a common range of threshold voltages defining a threshold window;
    configuring each memory cell to store N bits of data by partitioning the threshold window into $2^N$=k+1 bands of threshold voltages using k demarcation points D(i), where a lowest band denotes an erased state and is followed by k increasing bands that denotes k increasing programmed states P(i);
    providing a programming voltage as a series of pulses;
    programming in multiple programming passes a page of memory cells on a selected word line to respective target states;
    said multiple programming passes including a first programming pass and one of more subsequent programming passes to program all memory cells of the page to respective target states; and wherein the first programming pass further comprises:
        programming and verifying pulse by pulse a first set memory cells of the page having target states among an upper half of the k increasing programmed states, beginning with P([k+1]/2) and ending with P(k);
        said verifying is relative to a predetermined threshold voltage, the predetermined verify threshold voltage is such that it enables verifying of programming of all the memory cells having target states being one of P([k+1]/2) to P(k) to be placed near the middle of the threshold window while not exceeding D([k+1]/2+1);
        inhibiting programming of each memory cell of the first set that has been program-verified relative to the predetermined verify threshold voltage; and
        after all memory cells of the first set have been program-verified relative to the predetermined verify threshold,
        selectively disabling said inhibiting programming of each memory cell having a target state P([k+1]/2+x) to programming with additional x pulses, without intervening program-verifying.

2. The method as in claim 1, wherein:
    the programming voltage in the first programming pass has pulses that programs at a faster rate than that of the subsequent programming pass.

3. The method as in claim 1, wherein N=2.

4. The method as in claim 1, wherein N=3.

5. The method as in claim 1, wherein the nonvolatile memory is flash memory.

6. The method as in any claim 1, wherein the array of memory cells has NAND architecture.

7. The method as in claim 1, wherein the nonvolatile memory is embodiment in a memory card.

8. A method of programming a nonvolatile memory, comprising:
    providing the nonvolatile memory with an array of memory cells, each memory cell having a common range of threshold voltages defining a threshold window;
    configuring each memory cell to store N bits of data by partitioning the threshold window into $2^N$=k+1 bands of threshold voltages using k demarcation points D(i), where a lowest band denotes an erased state and is followed by k increasing bands that denotes k increasing programmed states P(i);
    providing a programming voltage as a series of pulses;
    programming in multiple programming passes a page of memory cells on a selected word line to respective target states;
    said multiple programming passes including a first programming pass and one of more subsequent programming passes to program all memory cells of the page to respective target states; and wherein the first programming pass further comprises:
        programming and verifying pulse by pulse a first set memory cells of the page having target states among an upper half of the k increasing programmed states, beginning with P([k+1]/2) and ending with P(k);
        said verifying is relative to a predetermined threshold voltage, the predetermined verify threshold voltage is such that it enables verifying of programming of all the memory cells having target states being one of P([k+1]/2) to P(k) to be placed near the middle of the threshold window while not exceeding D([k+1]/2+1);
        inhibiting programming of each memory cell of the first set that has been program-verified relative to the predetermined verify threshold voltage; and
        while ongoing programming pulses are still being applied to the page of memory cells until all memory cells of the first set have been program-verified relative to the predetermined verify threshold, selectively disabling said inhibiting programming of each memory cell having a target state P([k+1]/2+x) to programming with up to x additional ongoing programming pulses, without intervening program-verifying.

9. The method as in claim 8, wherein:
the programming voltage in the first programming pass has pulses that programs at a faster rate than that of the subsequent programming pass.

10. The method as in claim 8, wherein N=2.

11. The method as in claim 8, wherein N=3.

12. The method as in claim 8, wherein the nonvolatile memory is flash memory.

13. The method as in any claim 8, wherein the array of memory cells has NAND architecture.

14. The method as in claim 8, wherein the nonvolatile memory is embodiment in a memory card.

15. A nonvolatile memory, comprising:
an array of memory cells, each memory cell having a common range of threshold voltages defining a threshold window;
each memory cell configured to store N bits of data by having the threshold window partitioned into $2^N$=k+1 bands of threshold voltages using k demarcation points D(i), where a lowest band denotes an erased state and is followed by k increasing bands that denotes k increasing programmed states P(i);
a power supply for providing a programming voltage as a series of pulses;
a control circuit for controlling programming in multiple programming passes a page of memory cells on a selected word line to respective target states;
said multiple programming passes including a first programming pass and one of more subsequent programming passes to program all memory cells of the page to respective target states; and wherein the first programming pass further comprises:
programming and verifying pulse by pulse a first set memory cells of the page having target states among an upper half of the k increasing programmed states, beginning with P([k+1]/2) and ending with P(k);
said verifying is relative to a predetermined threshold voltage, the predetermined verify threshold voltage is such that it enables verifying of programming of all the memory cells having target states being one of P([k+1]/2) to P(k) to be placed near the middle of the threshold window while not exceeding D([k+1]/2+1);
inhibiting programming of each memory cell of the first set that has been program-verified relative to the predetermined verify threshold voltage; and after all memory cells of the first set have been program-verified relative to the predetermined verify threshold,
selectively disabling said inhibiting programming of each memory cell having a target state P([k+1]/2+x) to programming with additional x pulses, without intervening program-verifying.

16. A nonvolatile memory, comprising:
an array of memory cells, each memory cell having a common range of threshold voltages defining a threshold window;
each memory cell configured to store N bits of data by having the threshold window partitioned into $2^N$=k+1 bands of threshold voltages using k demarcation points D(i), where a lowest band denotes an erased state and is followed by k increasing bands that denotes k increasing programmed states P(i);
a power supply for providing a programming voltage as a series of pulses;
a control circuit for controlling programming in multiple programming passes a page of memory cells on a selected word line to respective target states;
said multiple programming passes including a first programming pass and one of more subsequent programming passes to program all memory cells of the page to respective target states; and wherein the first programming pass further comprises:
programming and verifying pulse by pulse a first set memory cells of the page having target states among an upper half of the k increasing programmed states, beginning with P([k+1]/2) and ending with P(k);
said verifying is relative to a predetermined threshold voltage, the predetermined verify threshold voltage is such that it enables verifying of programming of all the memory cells having target states being one of P([k+1]/2) to P(k) to be placed near the middle of the threshold window while not exceeding D([k+1]/2+1);
inhibiting programming of each memory cell of the first set that has been program-verified relative to the predetermined verify threshold voltage; and
while ongoing programming pulses are still being applied to the page of memory cells until all memory cells of the first set have been program-verified relative to the predetermined verify threshold,
selectively disabling said inhibiting programming of each memory cell having a target state P([k+1]/2+x) to programming with up to x additional ongoing programming pulses, without intervening program-verifying.

* * * * *